United States Patent
Kang et al.

(10) Patent No.: US 12,431,081 B2
(45) Date of Patent: *Sep. 30, 2025

(54) DISPLAY DEVICE

(71) Applicant: Samsung Display Co., Ltd., Yongin-si (KR)

(72) Inventors: Jang Mi Kang, Seoul (KR); Ji Sun Kim, Seoul (KR); Mu Kyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/367,981

(22) Filed: Sep. 13, 2023

(65) Prior Publication Data

US 2024/0005878 A1 Jan. 4, 2024

Related U.S. Application Data

(63) Continuation of application No. 17/888,487, filed on Aug. 16, 2022, now Pat. No. 11,783,783, which is a
(Continued)

(30) Foreign Application Priority Data

Sep. 15, 2017 (KR) ........................ 10-2017-0118887

(51) Int. Cl.
*G09G 3/20* (2006.01)
*G09G 3/3233* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC ..... G09G 2300/0426; G09G 2300/043; G09G 2300/0819; G09G 2300/0842;
(Continued)

(56) References Cited

U.S. PATENT DOCUMENTS 9,231,039 B2   1/2016 Kim
9,236,484 B2   1/2016 Kim et al.
(Continued)

FOREIGN PATENT DOCUMENTS

JP       2005037919     2/2005
KR   10-2003-0003446   1/2003
(Continued)

OTHER PUBLICATIONS

Notice of Allowance issued Aug. 25, 2020, in U.S. Appl. No. 16/129,796.
(Continued)

*Primary Examiner* — Insa Sadio
(74) *Attorney, Agent, or Firm* — Innovation Counsel LLP

(57) ABSTRACT

A display device including a light-emitting diode, a first transistor, a second transistor, a data line connected to the second transistor and configured to transmit a data signal, a third transistor, a first signal line connected to a gate electrode of the second transistor and configured to transmit a first signal, a second signal line connected to a gate electrode of the third transistor and configured to transmit a second signal, and a connect portion connected to a gate electrode of the first transistor and an electrode of the third transistor, in which the connect portion overlaps the first signal line and the second signal line, and an overlapping area between the connect portion and the first signal line is different from an overlapping area between the connect portion and the second signal line.

21 Claims, 11 Drawing Sheets

Related U.S. Application Data continuation of application No. 17/135,806, filed on Dec. 28, 2020, now Pat. No. 11,462,178, which is a continuation of application No. 16/129,796, filed on Sep. 13, 2018, now Pat. No. 10,878,759.

(51) Int. Cl.
| | |
|---|---|
| G09G 3/3258 | (2016.01) |
| G09G 3/3266 | (2016.01) |
| G09G 3/3283 | (2016.01) |
| G09G 3/3291 | (2016.01) |
| H10D 86/40 | (2025.01) |
| H10D 86/60 | (2025.01) |
| H10K 59/12 | (2023.01) |
| H10K 59/121 | (2023.01) |
| H10K 59/131 | (2023.01) |

(52) U.S. Cl.
CPC ......... *G09G 3/3283* (2013.01); *G09G 3/3291* (2013.01); *H10D 86/421* (2025.01); *H10D 86/423* (2025.01); *H10D 86/441* (2025.01); *H10D 86/471* (2025.01); *H10D 86/481* (2025.01); *H10D 86/60* (2025.01); *G09G 2300/0426* (2013.01); *G09G 2300/043* (2013.01); *G09G 2310/0264* (2013.01); *H10K 59/12* (2023.02); *H10K 59/1216* (2023.02); *H10K 59/131* (2023.02)

(58) Field of Classification Search
CPC ... G09G 2300/0861; G09G 2310/0264; G09G 3/3233; G09G 3/3258; G09G 3/3266; G09G 3/3283; G09G 3/3291; H01L 27/1222; H01L 27/1225; H01L 27/124; H01L 27/1251; H01L 27/1255; H10K 59/12; H10K 59/1216; H10K 59/131
See application file for complete search history.

(56) References Cited

U.S. PATENT DOCUMENTS

| | | | |
|---|---|---|---|
| 10,504,432 B2 | 12/2019 | Lin et al. | |
| 2004/0263506 A1* | 12/2004 | Koyama | G09G 3/3225 |
| | | | 345/204 |
| 2010/0182223 A1 | 7/2010 | Choi et al. | |
| 2011/0084947 A1 | 4/2011 | Chung et al. | |
| 2013/0002616 A1* | 1/2013 | Kim | H01L 27/1214 |
| | | | 345/204 |
| 2014/0139502 A1 | 5/2014 | Han | |
| 2015/0049126 A1 | 2/2015 | Jung | |
| 2016/0129186 A1 | 5/2016 | Douglas et al. | |
| 2017/0111917 A1 | 4/2017 | Aiba et al. | |
| 2024/0128274 A1 | 4/2024 | Gupta et al. | |

FOREIGN PATENT DOCUMENTS

| | | |
|---|---|---|
| KR | 10-0745413 | 8/2007 |
| KR | 10-0822205 | 4/2008 |
| KR | 10-2010-0086256 | 7/2010 |
| KR | 10-1048965 | 7/2010 |
| KR | 10-2011-0038393 | 4/2011 |
| KR | 10-2013-0007065 | 1/2013 |
| KR | 10-2014-0064480 | 5/2014 |
| KR | 10-2015-0019592 | 2/2015 |
| KR | 10-2015-0069278 | 6/2015 |
| KR | 10-2015-0100462 | 9/2015 |
| KR | 10-2016-0129186 | 11/2016 |

OTHER PUBLICATIONS

Notice of Allowance issued Oct. 29, 2021, for Korean Patent Application No. 10-2017-0118887 (with English Concise Explanation).
Non-Final Office Action dated Feb. 3, 2022, issued to U.S. Appl. No. 17/135,806.
Notice of Allowance dated May 2, 2022, issued to U.S. Appl. No. 17/135,806.
Written Decision on Registration dated Dec. 25, 2022, issued to Korean Patent Application No. 10-2022-0080438 (with English Translation.
Notice of Allowance dated Jun. 13, 2023, issued to U.S. Appl. No. 17/888,487.

* cited by examiner

DISPLAY DEVICE

CROSS REFERENCE TO RELATED APPLICATIONS

This application is a continuation of U.S. patent application Ser. No. 17/888,487, filed on Aug. 16, 2022 (now U.S. Pat. No. 11,783,783 issued Oct. 10, 2023), which is a continuation of U.S. patent application Ser. No. 17/135,806, filed on Dec. 28, 2020 (now U.S. Pat. No. 11,462,178 issued Oct. 4, 2022), which is a continuation of U.S. patent application Ser. No. 16/129,796, filed on Sep. 13, 2018 (now U.S. Pat. No. 10,878,759 issued Dec. 29, 2020), and claims priority from and the benefit of Korean Patent Application No. 10-2017-0118887, filed on Sep. 15, 2017, each of which is hereby incorporated by reference for all purposes as if fully set forth herein.

BACKGROUND

Field

Exemplary implementations of the invention relate generally to a display device, and, more specifically, to an organic light-emitting display device having pixels including PMOS transistors and NMOS transistors.

DISCUSSION OF THE BACKGROUND

With advancement of multimedia technology, the importance of display devices has increased. Thus, various types of display devices, such as a liquid crystal display (LCD) device and an organic light-emitting display device, have been used. Among various types of display devices, an organic light-emitting display device displays an image using an organic light-emitting device, which emits light through recombination of electrons and holes. The organic light-emitting display device includes a plurality of transistors for supplying a driving current to the organic light-emitting device.

Generally, transistors included in an organic light-emitting display device are PMOS transistors but research has been conducted on an organic light-emitting display device including NMOS transistors or including PMOS transistors and NMOS transistors.

A PMOS transistor and an NMOS transistor have different characteristics. The PMOS and NMOS transistors are also different in terms of whether a kickback voltage caused by parasitic capacitance is a positive voltage or a negative voltage. Thus, when some or all of the PMOS transistors are replaced with NMOS transistors, kickback voltage characteristics may be changed.

The above information disclosed in this Background section is only for understanding of the background of the inventive concepts, and, therefore, it may contain information that does not constitute prior art.

SUMMARY

Devices constructed according to exemplary implementations of the invention are capable of preventing a voltage of a gate electrode of a transistor from being excessively reduced due to a kickback.

According to an exemplary implementation of the invention, a display device includes a light-emitting diode; a first transistor configured to supply a driving current to the light-emitting diode; a second transistor configured to transmit a data signal to the first transistor; a third transistor configured to transmit the data signal compensated with a threshold voltage to a gate electrode of the first transistor; a first scan line connected to a gate electrode of the second transistor; a second scan line connected to a gate electrode of the third transistor and insulated from the first scan line; and a conductive pattern connected to the gate electrode of the first transistor and insulated from the first scan line and the second scan line, in which the conductive pattern overlaps the first scan line and the second scan line, and the conductive pattern includes a stem part extending in one direction, and a branch part branching from the stem part and overlapping the first scan line.

In an exemplary implementation, the second transistor may be one of a PMOS transistor and an NMOS transistor, and the third transistor may be the other one of the PMOS and the NMOS transistor.

In an exemplary implementation, the first transistor and the second transistor may be PMOS transistors, and the third transistor may be an NMOS transistor.

In an exemplary implementation, the display device may further include a first parasitic capacitor formed between the gate electrode of the second transistor and the gate electrode of the first transistor; and a second parasitic capacitor formed between the gate electrode of the third transistor and the gate electrode of the first transistor.

In an exemplary implementation, the first parasitic capacitor may have a capacitance greater than or equal to a capacitance of the second parasitic capacitor.

In an exemplary implementation, an overlapping area of the conductive pattern and the first scan line may be greater than that of the conductive pattern and the second scan line.

In an exemplary implementation, the PMOS transistor may include polycrystalline silicon, and the NMOS transistor may include an oxide semiconductor.

In an exemplary implementation, the gate electrode of the first transistor may be connected to a second electrode of the third transistor, a first electrode of the first transistor may be connected to a second electrode of the second transistor, and a second electrode of the first transistor may be connected to a first electrode of the third transistor.

In an exemplary implementation, the branch part may include a first branch part extending in a first direction intersecting a direction to which the stem part extends.

In an exemplary implementation, the branch part may further include a second branch part extending in a second direction opposite to the first direction.

In an exemplary implementation, a line width of the first scan line may increase around a region of the first scan line overlapping the branch part.

According to another exemplary implementation of the invention, a display device includes: a light-emitting diode; a first transistor configured to supply a driving current to the light-emitting diode; a second transistor configured to transmit a data signal to the first transistor; a first scan line connected to a gate electrode of the second transistor; and a conductive pattern connected to a gate electrode of the first transistor and insulated from the first scan line, in which the conductive pattern intersects the first scan line; and a line width of the conductive pattern in a region intersecting the first scan line is greater than that of the conductive pattern around the intersecting region of the conductive pattern.

In an exemplary implementation, the display device may further include: a third transistor configured to transmit the data signal compensated with a threshold voltage to the gate electrode of the first transistor; and a second scan line connected to a gate electrode of the third transistor, and insulted from the first scan line.

In an exemplary implementation, the first transistor and the second transistor may be PMOS transistors, and the third transistor may be an NMOS transistor.

In an exemplary implementation, the display device may further include a first parasitic capacitor formed between the gate electrode of the second transistor and the gate electrode of the first transistor; and a second parasitic capacitor formed between the gate electrode of the third transistor and the gate electrode of the first transistor.

In an exemplary implementation, the first parasitic capacitor may have a capacitance greater than or equal to a capacitance of the second parasitic capacitor.

According to another exemplary implementation of the invention, a display device includes: a substrate; a first semiconductor layer disposed on the substrate; a first insulating layer disposed on the first semiconductor layer; a first conductive layer disposed on the first insulating layer, and including a first signal line extending in a first direction; a second insulating layer disposed on the first conductive layer; a second conductive layer disposed on the second insulating layer, and including a second signal line extending in the first direction; a third insulating layer disposed on the second conductive layer; a second semiconductor layer disposed on the third insulating layer; and a third conductive layer disposed on the second semiconductor layer, and including a conductive pattern overlapping the first signal line and the second signal line, in which an overlapping area of the conductive pattern and the first signal line is greater than that of the conductive pattern and the second signal line.

In an exemplary implementation, the first signal line may be configured to transmit a first signal having one of a logic high level and a logic low level, and the second signal line may be configured to transmit a second signal having the other on of the logic high level and the logic low level at the same point of time.

In an exemplary implementation, the first conductive layer may further include an electrode spaced apart from the first signal line, and the electrode may be electrically connected to the conductive pattern via a contact hole passing through the third insulating layer and the second insulating layer.

In an exemplary implementation, the first semiconductor layer may include polycrystalline silicon; and the second semiconductor layer may include an oxide semiconductor.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
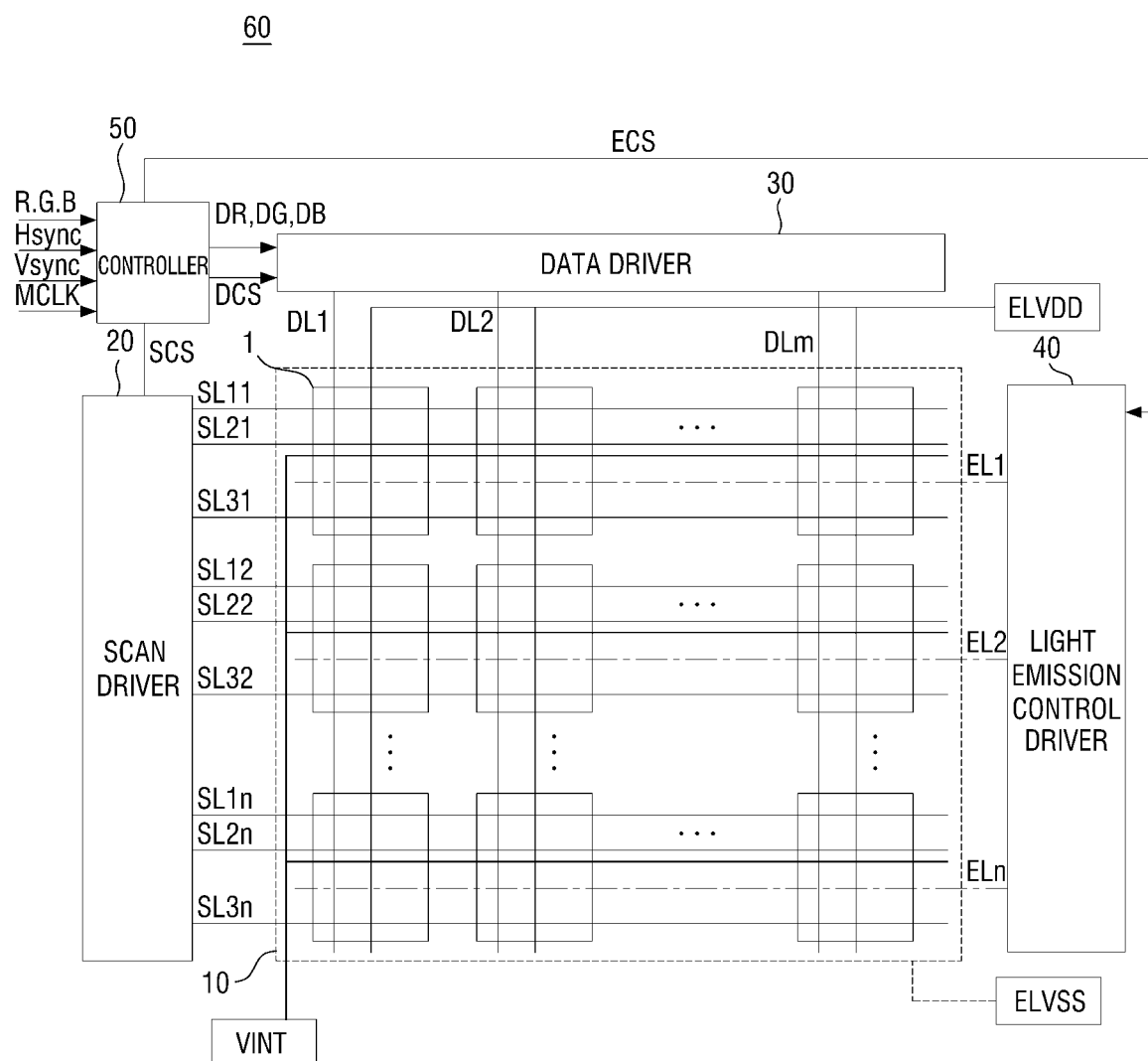
FIG. 1 is a schematic block diagram of an organic light-emitting display device constructed according to an exemplary embodiment of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic block diagram of an organic light-emitting display device constructed according to an exemplary embodiment of the invention.

Referring to FIG. 1, an organic light-emitting display device 60 includes a display unit 10 having a plurality of pixels 1, a scan driver 20, a data driver 30, a light emission control driver 40, and a controller 50.

The display unit 10 includes the pixels 1 arranged in a matrix at intersections of a plurality of scan lines SL11 to SL1n, SL21 to SL2n, and SL31 to SL3n, a plurality of data lines DL1 to DLm, and a plurality of emission control lines EL1 to ELn.

The scan lines SL11 to SL1n, SL21 to SL2n, and SL31 to SL3n and the emission control lines EL1 to ELn may extend in a row direction, and the data lines DL1 to DLm may extend in a column direction. The row direction and the column direction may be switched to each other. An initialization voltage VINT supply line may branch in units of rows and extend in the row direction. A first supply voltage ELVDD supply line may branch in units of columns and extend in the column direction. However, the inventive concepts are not limited thereto, and the extending directions of the initialization voltage VINT supply line and the first supply voltage ELVDD supply line may be variously changed.

For example, three scan lines SL11, SL21, and SL31, one data line DL1, one emission control line EL1, one initialization voltage VINT supply line, and one first supply voltage ELVDD supply line may pass through a pixel in a first row and a first column. Similarly, such lines may pass through the other pixels.

The scan driver 20 generates three scan signals and transmits the scan signals to each of the pixels via the scan lines SL11 to SL1n, SL21 to SL2n, and SL31 to SL3n. That is, the scan driver 20 sequentially supplies the scan signals to the first scan lines SL11 to SL1n, the second scan lines SL21 to SL2n, or the third scan lines SL31 to SL3n.

The data driver 30 supplies a data signal to each of pixels 1 via the data lines DL1 to DLm. The data signal is supplied to the pixel 1 selected by a first scan signal when the first scan signal is supplied to the first scan lines SL11 to SL1n.

The light emission control driver 40 generates and transmits a light emission control signal to each of the pixels via the emission control lines EL1 to ELn. The light emission control signal controls a light emission time of the pixel 1. The light emission control driver 40 may be omitted when the scan driver 20 generates the light emission control signal and the scan signal, or according to an inner structure of the pixel 1.

The controller 50 changes a plurality of image signals R, G, and B received from the outside into a plurality of image data signals DR, DG, and DB, and transmits the image data signals DR, DG, and DB to the data driver 30. Furthermore, the controller 50 receives a vertical synchronization signal Vsync, a horizontal synchronization signal Hsync, and a clock signal MCLK, generates control signals to control driving of the scan driver 20, the data driver 30, and the light emission control driver 40, and transmits the control signals to the scan driver 20, the data driver 30, and the light emission control driver 40. That is, the controller 50 generates and transmits a scan driving control signal SCS for controlling the scan driver 20, a data driving control signal DCS for controlling the data driver 30, and an emission driving control signal ECS for controlling the light emission control driver 40.

The first supply voltage ELVDD and a second supply voltage ELVSS are applied to each of the pixels 1. The first supply voltage ELVDD may be a certain high voltage. The second supply voltage ELVSS may be a voltage lower than the first supply voltage ELVDD.

Each of the pixels 1 emits light having certain brightness that corresponds to a driving current supplied to a light-emitting device, according to the data signal transmitted via the data lines DL1 to DLm.

The first supply voltage ELVDD, the second supply voltage ELVSS, the initialization voltage VINT, and the like may be supplied from an external voltage source.

Figure 2:
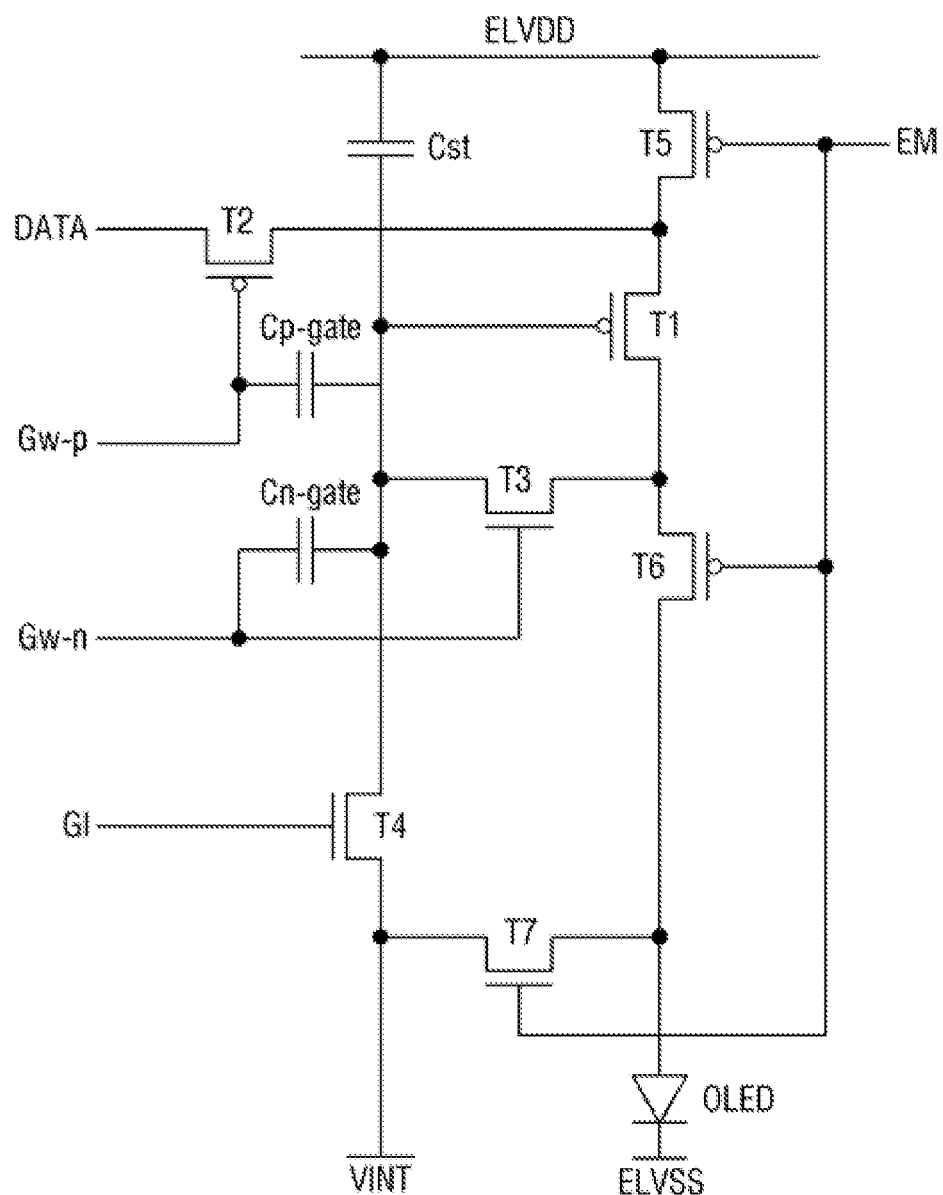
FIG. 2 is an equivalent circuit diagram of one pixel of an organic light-emitting display device constructed according to another exemplary embodiment of the invention.

FIG. 2 is an equivalent circuit diagram of one pixel of an organic light-emitting display device constructed according to another exemplary embodiment of the invention.

Referring to FIG. 2, a circuit of one pixel of the organic light-emitting display device includes an organic light-emitting diode (OLED), a plurality of transistors T1 to T7, and a storage capacitor Cst. A data signal DATA, a first scan signal Gw-p, a second scan signal Gw-n, a third scan signal GI, a light emission control signal EM, a first supply voltage ELVDD, a second supply voltage ELVSS, and an initialization voltage VINT are applied to the pixel circuit.

The OLED includes an anode electrode and a cathode electrode. The storage capacitor Cst includes a first electrode and a second electrode.

The transistors may include first to seventh transistors T1 to T7. Each of the transistors T1 to T7 includes a gate electrode, a first electrode, and a second electrode. The first or second electrode of each of the transistors T1 to T7 is a source electrode and the other is a drain electrode.

Each of the transistors T1 to T7 may be a thin film transistor. Each of the transistors T1 to T7 may be a PMOS transistor or an NMOS transistor. In one exemplary embodiment, the first transistor T1 may be a driving transistor, the second transistor T2 may be a data transfer transistor, the fifth transistor T5 may be a first light emission control transistor, and the sixth transistor T6 may be a second light emission control transistor, and the first, second, fifth, and sixth transistors T1, T2, T5, and T6 may be PMOS transistors. The third transistor T3 may be a compensation transistor, the fourth transistor T4 may be a first initialization transistor, and the seventh transistor T7 may be a second initialization transistor, and the third, fourth, and seventh transistors T3, T4, and T7 may be NMOS transistors. A PMOS transistor and an NMOS transistor have different characteristics. Since the third transistor T3, the fourth transistor T4, and the seventh transistor T7 are NMOS transistors having relatively outstanding turn-off characteristics, a leakage of a driving current Id may be reduced in a light emission period of the OLED.

Components of the pixel circuit will be described in detail below.

A gate electrode of the first transistor T1 is connected to the first electrode of the storage capacitor Cst. A first electrode of the first transistor T1 is connected to a first supply voltage ELVDD terminal via the fifth transistor T5. A second electrode of the first transistor T1 is connected to the anode electrode of the OLED via the sixth transistor T6. The first transistor T1 receives the data signal DATA and supplies a driving current Id to the OLED according to a switching operation of the second transistor T2.

A gate electrode of the second transistor T2 is connected to a first scan signal Gw-p terminal. A first electrode of the second transistor T2 is connected to a data signal DATA terminal. A second electrode of the second transistor T2 is connected to the first supply voltage ELVDD terminal via the fifth transistor T5 while being connected to the first electrode of the first transistor T1. The second transistor T2 is turned on by the first scan signal Gw-p and performs a switching operation of transmitting the data signal DATA to the first electrode of the first transistor T1.

A gate electrode of the third transistor T3 is connected to a second scan signal Gw-n terminal. A first electrode of the third transistor T3 is connected to the anode electrode of the OLED via the sixth transistor T6 while being connected to the second electrode of the first transistor T1. A second electrode of the third transistor T3 is connected to the first electrode of the storage capacitor Cst, a first electrode of the fourth transistor T4, and the gate electrode of the first transistor T1. The third transistor T3 is turned on by the second scan signal Gw-n and performs diode connection of the first transistor T1 by connecting the gate electrode and the second electrode of the first transistor T1. Thus, a voltage difference corresponding to a threshold voltage of the first transistor T1 occurs between the first electrode and the gate electrode of the first transistor T1. A threshold voltage variation of the first transistor T1 may be compensated for by supplying a threshold-voltage-compensated data signal DATA to the gate electrode of the first transistor T1.

A gate electrode of the fourth transistor T4 is connected to a third scan signal GI terminal. A second electrode of the fourth transistor T4 is connected to an initialization voltage VINT terminal. The first electrode of the fourth transistor T4 is connected to the first electrode of the storage capacitor Cst, the second electrode of the third transistor T3, and the gate electrode of the first transistor T1. The fourth transistor T4 is turned on by the third scan signal GI and applies the initialization voltage VINT to the gate electrode of the first transistor T1 to initialize a voltage of the gate electrode of the first transistor T1.

A gate electrode of the fifth transistor T5 is connected to a light emission control signal EM terminal. A first electrode of the fifth transistor T5 is connected to the first supply voltage ELVDD terminal. A second electrode of the fifth transistor T5 is connected to the first electrode of the first transistor T1 and the second electrode of the second transistor T2.

A gate electrode of the sixth transistor T6 is connected to the light emission control signal EM terminal. A first electrode of the sixth transistor T6 is connected to the second electrode of the first transistor T1 and the first electrode of the third transistor T3. A second electrode of the sixth transistor T6 is connected to the anode electrode of the OLED.

The fifth transistor T5 and the sixth transistor T6 are simultaneously turned on by the light emission control signal EM, and thus the driving current Id flows through the OLED.

A gate electrode of the seventh transistor T7 is connected to the light emission control signal EM terminal. A first electrode of the seventh transistor T7 is connected to the anode electrode of the OLED. A second electrode of the seventh transistor T7 is connected to the initialization voltage VINT terminal. The seventh transistor T7 is turned on by the light emission control signal EM and initializes the anode electrode of the OLED.

Although the seventh transistor T7 receives the same light emission control signal EM as the fifth transistor T5 and the sixth transistor T6, the seventh transistor T7 is an NMOS transistor while the fifth transistor T5 and the sixth transistor T6 are PMOS transistors. Thus, the seventh transistor T7, and the fifth transistor T5 and the sixth transistor T6 may be turned on at different timings. For example, when the light emission control signal EM is at a high level, the seventh transistor T7 is turned on while the fifth transistor T5 and the sixth transistor T6 are turned off. When the light emission control signal EM is at a low level, the seventh transistor T7 is turned off while the fifth transistor T5 and the sixth transistor T6 are turned on. Thus, initialization may not be performed by the seventh transistor T7 in a light emission time period during which the fifth transistor T5 and the sixth transistor T6 are turned on, and initialization may be performed by the seventh transistor T7 in a non-light emission time period during which the fifth transistor T5 and the sixth transistor T6 are turned off.

Although the exemplary embodiment of FIG. 2 is illustrated as the light emission control signal EM is supplied to the gate electrode of the seventh transistor T7, however, the inventive concept is not limited thereto. For example, a pixel circuit according to another exemplary embodiment may be configured such that the third scan signal GI is supplied to the gate electrode of the seventh transistor T7.

The second electrode of the storage capacitor Cst is connected to the first supply voltage ELVDD terminal. The first electrode of the storage capacitor Cst is connected to the gate electrode of the first transistor T1, the second electrode of the third transistor T3, and the first electrode of the fourth transistor T4. The cathode electrode of the OLED is connected to the second supply voltage ELVSS terminal. The OLED receives the driving current Id from the first transistor T1 and emits light to display an image.

According to an exemplary embodiment, the pixel circuit may further include parasitic capacitors Cp-gate and Cn-gate, which may provide an effect of a kickback voltage to the gate electrode of the first transistor T1. These parasitic capacitors may include a first parasitic capacitor Cp_gate provided between the gate electrode of the first transistor T1 and the gate electrode of the second transistor T2, and a second parasitic capacitor Cn_gate provided between the gate electrode of the first transistor T1 and the gate electrode of the third transistor T3. The parasitic capacitors Cp-gate and Cn-gate will be described in detail below.

A plan layout and a cross-sectional structure of a pixel as described above will be described in detail below.

Figure 3:
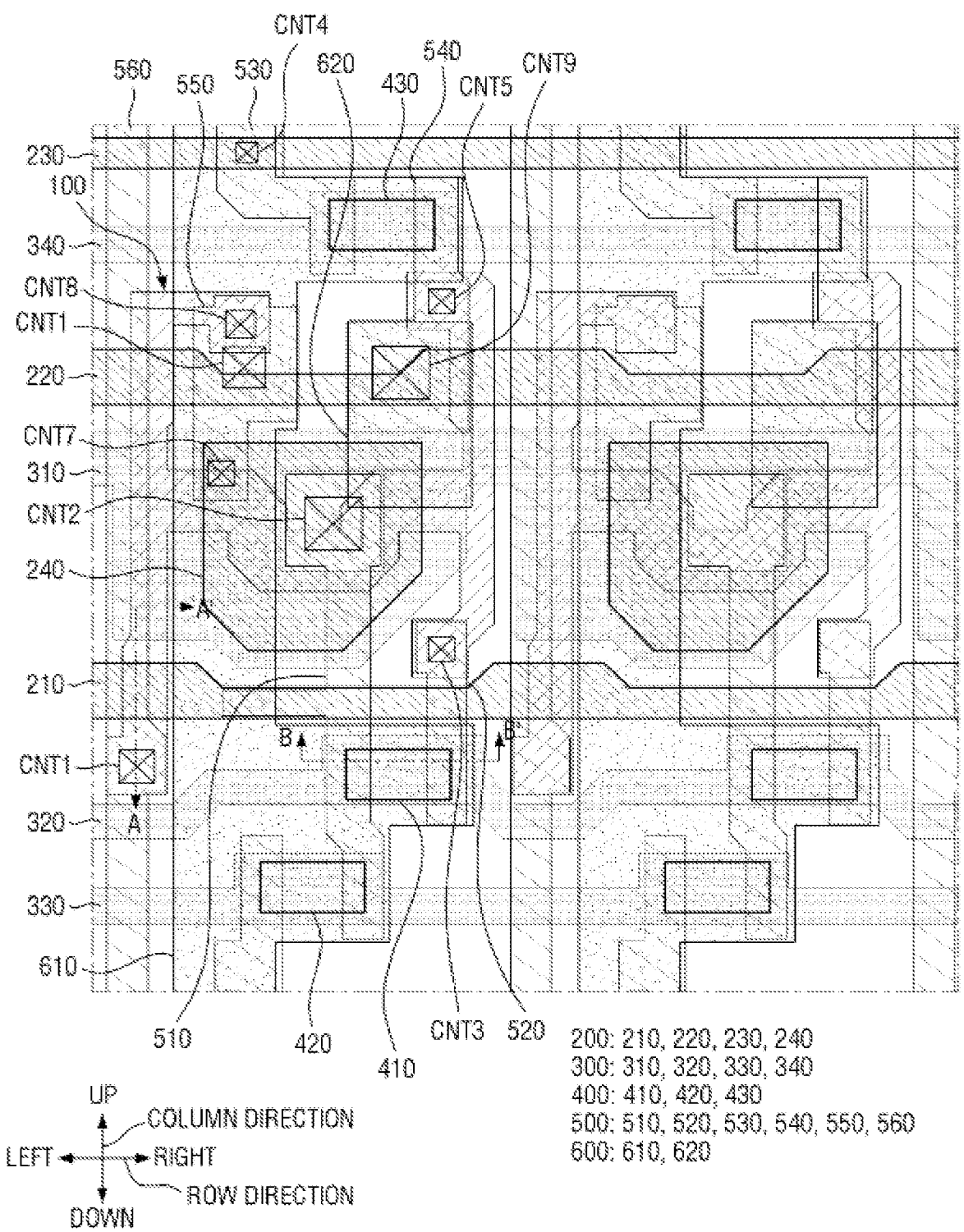
FIG. 3 is a layout diagram of one pixel of an organic light-emitting display device constructed according to another exemplary embodiment of the invention.
Figure 4:
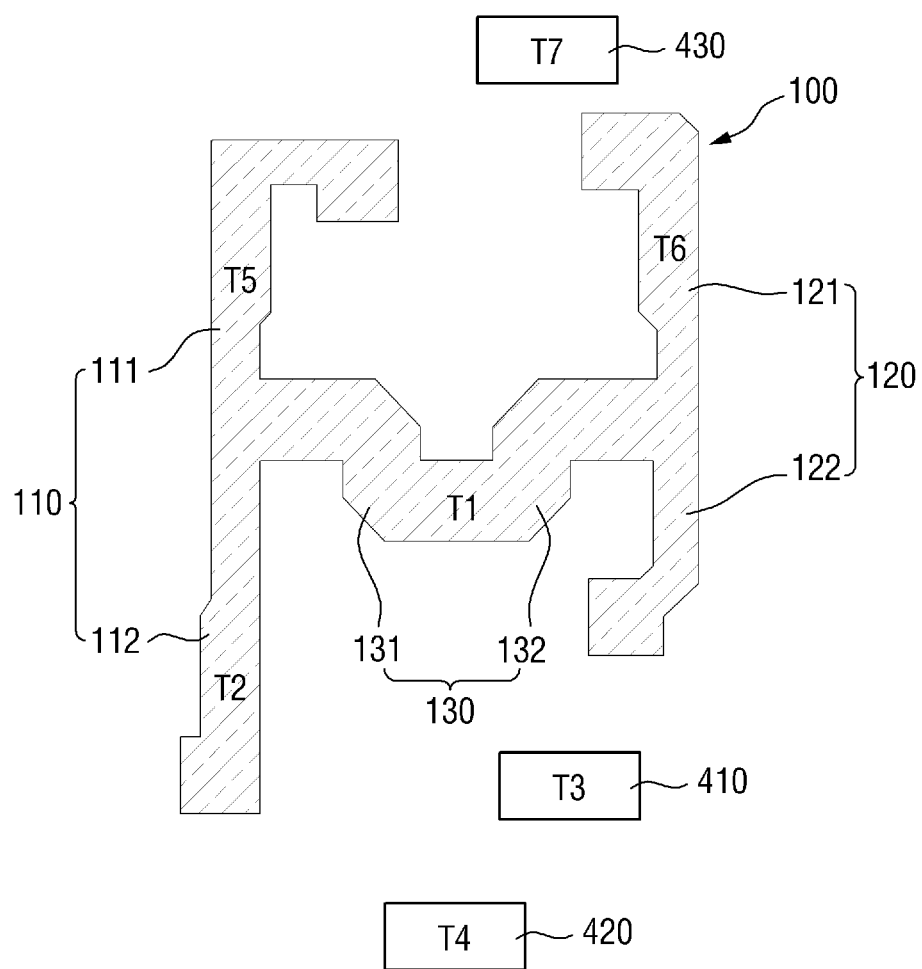
FIG. 4 is a layout diagram of a first semiconductor layer and a second semiconductor layer of FIG. 3.
Figure 5:
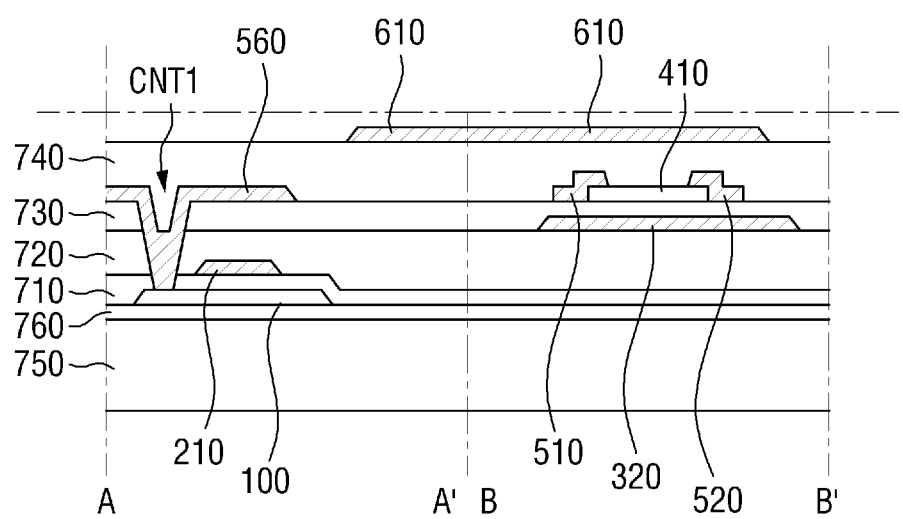
FIG. 5 is a cross-sectional view taken along lines A-A' and B-B' of FIG. 3.

FIG. 3 is a layout diagram of one pixel of an organic light-emitting display device constructed according to another exemplary embodiment of the invention. FIG. 4 is a layout diagram of a first semiconductor layer and a second semiconductor layer of FIG. 3. FIG. 5 is a cross-sectional view taken along lines A-A' and B-B' of FIG. 3. In exemplary embodiments described below, new reference numerals are allocated to some components even when the components are substantially the same as those described above with reference to FIGS. 1 and 2.

Referring to FIGS. 3 to 5, the pixel includes a plurality of transistors T1 to T7, a storage capacitor Cst, and an OLED. The storage capacitor and the OLED are described herein are substantially the same as those in FIG. 2.

Each of the transistors T1 to T7 includes a conductive layer forming an electrode, a semiconductor layer forming a channel, and an insulating layer. The first transistor T1, the second transistor T2, the fifth transistor T5, and the sixth transistor T6, which are PMOS transistors, may be top gate type transistors that have a gate electrode disposed above the semiconductor layer. The third transistor T3, the fourth transistor T4, and the seventh transistor T7, which are NMOS transistors, may be bottom gate type transistors that have a gate electrode disposed below the semiconductor layer.

The storage capacitor Cst includes conductive layers forming an electrode and an insulating layer provided between the conductive layers. The OLED includes conductive layers forming an anode electrode and a cathode electrode, and an organic emission layer provided between the conductive layers. The above-described elements may be electrically connected via a wire formed of a conductive layer and/or a via formed of a conductive material. The conductive material, the conductive layers, the semiconductor layer, the insulating layer, the organic emission layer, and the like are provided on a substrate 750.

A buffer layer 760, a lower semiconductor layer 100, a first insulating layer 710, a first conductive layer 200, a second insulating layer 720, a second conductive layer 300, a third insulating layer 730, an upper semiconductor layer 400, a third conductive layer 500, a fourth insulating layer 740, and a fourth conductive layer 600 may be disposed on the substrate 750. Each of the layers may be a single-layer film or a stacked film including a plurality of films. Other layers may be provided between the layers.

The substrate 750 supports the layers stacked thereon. When the organic light-emitting display device is a rear emission type or a dual emission type, a transparent substrate may be used. When the organic light-emitting display device is a front emission type, a transparent substrate or a semi-transparent, or non-transparent substrate may be used.

The substrate 750 may be formed of an insulating material, such as glass, quartz, or polymer resin. Examples of the polymer resin may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 750 may include metal.

The substrate 750 may be, but is not limited to, a rigid substrate or a flexible substrate, which may be bent, folded, or rolled up. A material of the flexible substrate may be polyimide (PI), but is not limited thereto.

The buffer layer 760 may be provided on an entire surface of the substrate 750. The buffer layer 760 may prevent diffusion of impurity ions, prevent permeation of moisture or external air, and perform a surface planarizing function. The buffer layer 760 may include silicon nitride, silicon oxide, silicon oxynitride, or the like. The buffer layer 760 may be omitted according to the type of the substrate 750, process conditions, or the like.

The lower semiconductor layer 100 is an active layer forming channels of the first transistor T1, the second transistor T2, the fifth transistor T5, and the sixth transistor T6.

The lower semiconductor layer 100 may be divided in units of pixels. The lower semiconductor layer 100 may have a specific pattern when viewed from the top. For example, the lower semiconductor layer 100 may include a first vertical part 110 and a second vertical part 120 generally extending in a column direction, and a horizontal part 130 generally extending in a row direction. The first vertical part 110, the second vertical part 120, and the horizontal part 130 may be physically connected to one another.

The first vertical part 110 may be located adjacent to a left side of the pixel. The second vertical part 120 may be located adjacent to a right side of the pixel. The first vertical part 110 and the second vertical part 120 may be spaced apart from each other. The first vertical part 110 may be longer than the second vertical part 120 in the column direction. The horizontal part 130 may connect middle parts of the first vertical part 110 and the second vertical part 120. As used herein, "upper portions 111 and 121" may refer to parts of the first vertical part 110 and the second vertical part 120 that are disposed above the middle parts connected to the horizontal part 130, and "lower portions 112 and 122" may refer to parts of the first vertical part 110 and the second vertical part 120 that are disposed below the middle parts connected to the horizontal part 130. A planar shape of the lower semiconductor layer 100 may have substantially an 'H' shape.

The channel of the fifth transistor T5 may be located on the upper portion 111 of the first vertical part 110. The channel of the second transistor T2 may be located on the lower portion 112 of the first vertical part 110. The channel of the sixth transistor T6 may be located on the upper portion 121 of the second vertical part 120. The channel of the first transistor T1 may be located on the horizontal part 130.

The horizontal part 130 may connect the first vertical part 110 and the second vertical part 120 at a shortest distance, or may include a first bent part 131, which is a left part thereof, and a second bent part 132, which is a right part thereof, as illustrated in FIG. 4. A total length of the horizontal part 130 may increase when the horizontal part 130 is bent a number of times.

The lower semiconductor layer 100 may include polycrystalline silicon. The polycrystalline silicon may be formed by crystallizing amorphous silicon. Examples of a method of crystallizing amorphous silicon include, but are not limited to, a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, etc. Other examples of the lower semiconductor layer 100 may include single crystalline silicon, low-temperature polycrystalline silicon, amorphous silicon, etc.

A region (source/drain region) of the lower semiconductor layer 100 connected to source/drain electrodes of each of the transistors T1, T2, T5, and T6 may be doped with impurity ions (e.g., p type impurity ions for a PMOS transistor). A trivalent dopant, such as boron (B), may be used as the p type impurity ions.

The first insulating layer 710 may be provided on the lower semiconductor layer 100, and generally, on the entire surface of the substrate 750. The first insulating layer 710 may be a gate insulating film having a gate insulating function.

The first insulating layer 710 may include a silicon compound, a metal oxide, or the like. For example, the first insulating layer 710 may include silicon oxide, silicon nitride, silicon oxynitride, aluminum oxide, tantalum oxide, hafnium oxide, zirconium oxide, titanium oxide, or the like. The silicon oxide, the silicon nitride, the silicon oxynitride, the aluminum oxide, the tantalum oxide, the hafnium oxide, the zirconium oxide, and the titanium oxide may be used solely or in combination. The first insulating layer 710 may be a single-layer film or a multilayer film having stacked films of different materials.

The first conductive layer 200 is provided on the first insulating layer 710. The first conductive layer 200 may include a first scan line 210 for transmitting a first scan signal (hereinafter, referred to as the first scan signal Gw-p of FIG. 2), a gate electrode 240 of the first transistor T1, a first light emission control line 220 for transmitting a light emission control signal (hereinafter, referred to as the light emission control signal EM of FIG. 2), and an initialization voltage line 230 for supplying an initialization voltage (hereinafter, referred to as the initialization voltage VINT of FIG. 2).

The first scan line 210 may include a gate electrode of the second transistor T2. The first light emission control line 220 may include a gate electrode of the fifth transistor T5 and a gate electrode of the sixth transistor T6.

The first scan line 210, the first light emission control line 220, and the initialization voltage line 230 may extend in a row direction. Each of the first scan line 210, the first light emission control line 220, and the initialization voltage line 230 may extend in the row direction to a pixel neighboring the pixel of FIG. 3.

The first scan line 210 may be located on a lower portion of the pixel. The first scan line 210 may overlap the lower portion 112 of the first vertical part 110 of the lower semiconductor layer 100. The gate electrode of the second transistor T2 may be formed in an overlapping region between the first scan line 210 and the lower portion 112. A portion of the first vertical part 110 of the lower semiconductor layer 100 below the overlapping region may be a first electrode region of the second transistor T2, and a portion of the first vertical part 110 of the lower semiconductor layer 100 above the overlapping region may be a second electrode region of the second transistor T2. The first scan line 210 may not overlap the lower portion 122 of the second vertical part 120.

The first light emission control line 220 may be located above the first scan line 210 and overlap the upper portion 111 of the first vertical part 110 and the upper portion 121 of the second vertical part 120 of the lower semiconductor layer 100 when viewed from the top.

The gate electrode of the fifth transistor T5 may be formed in an overlapping region between the first light emission control line 220 and the upper portion 111 of the first vertical part 110 of the lower semiconductor layer 100. A portion of the first vertical part 110 of the lower semiconductor layer 100 above the overlapping region may be a first electrode region of the fifth transistor T5, and a portion of the first vertical part 110 of the lower semiconductor layer 100 below the overlapping region may be a second electrode region of the fifth transistor T5.

The gate electrode of the sixth transistor T6 may be formed in an overlapping region between the first light emission control line 220 and the upper portion 121 of the second vertical part 120. The second vertical part 120 of the lower semiconductor layer 100 above the overlapping region may be a first electrode region of the sixth transistor T6, and the second vertical part 120 of the lower semiconductor layer 100 below the overlapping region may be a second electrode region of the sixth transistor T6.

Widths of the gate electrode of the second transistor T2, the gate electrode of the fifth transistor T5, and the gate electrode of the sixth transistor T6 in the corresponding overlapping regions may be greater than widths of lines near these gate electrodes, but exemplary embodiments are not limited thereto.

The initialization voltage line 230 may be located on an upper portion of the pixel when viewed from the top. The initialization voltage line 230 may not overlap the lower semiconductor layer 100.

The gate electrode 240 of the first transistor T1 may be located in a center part of the pixel. The gate electrode 240 of the first transistor T1 may be located between the first scan line 210 and the first light emission control line 220 when viewed from the top. The gate electrode 240 of the first transistor T1 may be divided in units of pixels.

The gate electrode 240 of the first transistor T1 overlaps the horizontal part 130 of the lower semiconductor layer 100. A portion of the horizontal part 130 of the lower semiconductor layer 100 located at a left side of an overlapping region between the gate electrode 240 and the horizontal part 130 may be a first electrode region of the first transistor T1, and a portion of the horizontal part 130 of the lower semiconductor layer 100 located at a right side of the overlapping region may be a second electrode region of the first transistor T1.

The first conductive layer 200 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 200 may be a single-layer film or a multilayer film.

The second insulating layer 720 insulates the first conductive layer 200 and the second conductive layer 300 from each other. The second insulating layer 720 may be provided on the first conductive layer 200, and generally, on the entire surface of the substrate 750. The second insulating layer 720 may be an interlay insulating film.

The second insulating layer 720 may include an inorganic insulating material, such as silicon oxide, silicon nitride, silicon oxynitride, hafnium oxide, aluminum oxide, titanium oxide, tantalum oxide, or zinc oxide, or an organic insulating material, such as polyacrylates resin, epoxy resin, phenolic resin, polyamides resin, polyimides rein, unsaturated polyesters resin, poly phenylenethers resin, polyphenylenesulfides resin, or benzocyclobutene (BCB). The second insulating layer 720 may be either a single-layer film or a multilayer film including stacked films formed of different materials.

The second conductive layer 300 is provided on the second insulating layer 720. The second conductive layer 300 may include a second scan line 320 for transmitting a second scan signal (e.g., the second scan signal Gw-n of FIG. 2), a third scan line 330 for transmitting a third scan signal (e.g., the third scan signal Gw-p of FIG. 2), a storage capacitor electrode line 310, and a second light emission control line 340 for transmitting a light emission control signal EM.

The second scan line 320, the third scan line 330, the storage capacitor electrode line 310, and the second light emission control line 340 may extend in a row direction. Each of the second scan line 320, the third scan line 330, the storage capacitor electrode line 310, and the second light emission control line 340 may extend in the row direction to a pixel neighboring the pixel of FIG. 3. The second scan line 320, the third scan line 330, and the second light emission control line 340 may not overlap the lower semiconductor layer 100.

The second scan line 320 may be located below the first scan line 210 in the pixel when viewed from the top. The second scan line 320 is insulated from the first scan line 210. The third scan line 330 may be located below the second scan line 320 in the pixel. The second light emission control line 340 may be located between the initialization voltage line 230 and the first light emission control line 220 when viewed from the top. Although not shown, the second light emission control line 340 may be electrically connected to the first light emission control line 220 outside a display unit via a contact hole, or may directly receive the same light emission control signal EM as the first light emission control line 220 from the light emission control driver 40 of FIG. 1. In another exemplary embodiment, the first light emission control line 220 or the second light emission control line 340 may be omitted.

The second scan line 320 may include a gate electrode of the third transistor T3. The third scan line 330 may include a gate electrode of the fourth transistor T4. The second light emission control line 340 may include a gate electrode of the seventh transistor T7. Widths of the gate electrode of the third transistor T3, the gate electrode of the fourth transistor T4, and the gate electrode of the seventh transistor T7 may be greater than widths of lines therearound, but exemplary embodiments are not limited thereto.

The storage capacitor electrode line 310 may cross a center part of the pixel and be located between the second scan line 320 and the second light emission control line 340 when viewed from the top. The storage capacitor electrode line 310 overlaps the gate electrode 240 of the first transistor T1 while having the second insulating layer 720 between the storage capacitor electrode line 310 and the gate electrode 240, thereby forming the storage capacitor Cst. The gate electrode 240 of the first transistor T1 may be a first electrode of the storage capacitor Cst, an expanded region of the storage capacitor electrode line 310 overlapping the gate electrode 240 may be a second electrode of the storage capacitor Cst, and the second insulating layer 720 between the storage capacitor electrode line 310 and the gate electrode 240 may be a dielectric of the storage capacitor Cst.

A width of a region of the storage capacitor electrode line 310, which overlaps the gate electrode 240 of the first transistor T1, may be increased. The overlapping region of the storage capacitor electrode line 310 may include an opening overlapping the gate electrode 240 of the first transistor T1 below the storage capacitor electrode line 310.

The second conductive layer 300 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 730 covers the second conductive layer 300. The third insulating layer 730 may be generally provided on the entire surface of the substrate 750. The third insulating layer 730 may be a gate insulating film having a gate insulating function. The third insulating layer 730 may include the same material as that of the first insulating layer 710, or at least one material of the first insulating layer 710 described above. The third insulating layer 730 may be a single-layer film or a multilayer film having stacked films of different materials.

The upper semiconductor layer 400 is provided on the third insulating layer 730. The upper semiconductor layer 400 may include a plurality of semiconductor patterns separated from each other in one pixel. For example, the upper semiconductor layer 400 may include a first upper semiconductor pattern 410 provided to overlap the gate electrode of the third transistor T3 to form the channel of the third transistor T3, a second upper semiconductor pattern 420 provided to overlap the gate electrode of the fourth transistor T4 to form the channel of the fourth transistor T4, and a third upper semiconductor pattern 430 provided to overlap the gate electrode of the seventh transistor T7 to form the channel of the seventh transistor T7. The first upper semiconductor pattern 410, the second upper semiconductor pattern 420, and the third upper semiconductor pattern 430 may each have a rectangular shape, but are not limited thereto. Widths of the first upper semiconductor pattern 410, the second upper semiconductor pattern 420, and the third upper semiconductor pattern 430 may be less than those of the overlapping gate electrodes but embodiments are not limited thereto.

The upper semiconductor layer 400 may include an oxide semiconductor. For example, the upper semiconductor layer 400 may include a binary compound ($AB_x$), a ternary compound ($AB_xC_y$), or a quaternary compound ($AB_xC_yD_z$) containing indium, zinc, gallium, tin, titanium, aluminum, hafnium (Hf), zirconium (Zr), magnesium (Mg), or the like. In one exemplary embodiment, the upper semiconductor layer 400 may include an oxide containing indium, tin, and titanium (ITZO), or an oxide containing indium, gallium, and tin (IGZO).

The third conductive layer 500 may include a data line 560 for transmitting a data signal (e.g., the data signal DATA of FIG. 2), and a plurality of data patterns 510, 520, 530, 540, and 550.

The data line 560 may extend in the column direction. The data line 560 may extend in the column direction to a pixel neighboring the pixel of FIG. 3. The data line 560 may be located adjacent to the left side of the pixel. The data line 560 may overlap the first vertical part 110 of the lower semiconductor layer 100.

The data line 560 may be in contact with the lower portion 112 of the first vertical part 110 of the lower semiconductor layer 100 via a first contact hole CNT1, which exposes the lower portion 112 of the first vertical part 110 of the lower semiconductor layer 100 and passing through the third insulating layer 730, the second insulating layer 720, and the first insulating layer 710. The first contact hole CNT1 may be located below the first scan line 210 when viewed from the top, but is not limited thereto.

The data patterns may include a first data pattern 510, a second data pattern 520, a third data pattern 530, a fourth data pattern 540, and a fifth data pattern 550. The data patterns 510, 520, 530, 540, and 550 each have a shape roughly extending in the column direction. Lengths of the data patterns 510, 520, 530, 540, and 550 in the column direction are less than that of the pixel in the column direction. The data patterns 510, 520, 530, 540, and 550 are physically spaced apart from each other. The data patterns 510, 520, 530, 540, and 550 each electrically connect parts separated apart from each other, and some of the data patterns 510, 520, 530, 540, and 550 may form a first or second electrode of an NMOS transistor. When a data pattern overlaps the upper semiconductor layer 400, the data pattern may be in direct contact with an upper surface of the upper semiconductor layer 400, or may be in contact with the upper surface of the upper semiconductor layer 400 having an ohmic contact layer between the data pattern and the upper semiconductor layer 400.

The first data pattern 510 may overlap the gate electrode 240 of the first transistor T1. The first data pattern 510 may be electrically connected to the gate electrode 240 of the first transistor T1 via a second contact hole CNT2, which exposes the gate electrode 240 of the first transistor T1 and passing through the third insulating layer 730 and the second insulating layer 720 in the overlapping region. The second contact hole CNT2 may be located in the opening of the storage capacitor electrode line 310. The first data pattern 510 in the second contact hole CNT2 and the storage capacitor electrode line 310 adjacent thereto may be insulated from each other by the third insulating layer 730.

The first data pattern 510 may extend downward from an overlapping region between the first data pattern 510 and the gate electrode 240 of the first transistor T1, cross the first scan line 210 to be insulated from the first scan line 210, and overlap the second scan line 320 while being insulated from the second scan line 320. The first data pattern 510 may further extend downward to cross the second scan line 320. The first data pattern 510 may overlap a left side of the first upper semiconductor pattern 410 and a right side of the second upper semiconductor pattern 420. A portion of the first data pattern 510 located at the left side of the first upper semiconductor pattern 410 may be a second electrode of the third transistor T3. A portion of the first data pattern 510 located at the right side of the second upper semiconductor pattern 420 may be a first electrode of the fourth transistor T4.

The first data pattern 510 may include a first branch part (see reference numeral '511' of FIG. 6), which branches from a region of the first data pattern 510 crossing the first scan line 210, protrudes in the direction to which the first scan line 210 extends, and overlaps the first scan line 210. The first branch part 511 of the first data pattern 510 increases a parasitic capacitance of a first parasitic capacitor Cp-gate, as will be described in detail below.

The second data pattern 520 may overlap the lower portion 122 of the second vertical part 120 of the lower semiconductor layer 100. The second data pattern 520 may be in contact with the lower portion 122 of the second vertical part 120 of the lower semiconductor layer 100 via a third contact hole CNT3, which exposes the lower portion 122 of the second vertical part 120 of the lower semiconductor layer 100 and passing through the third insulating layer 730, the second insulating layer 720, and the first insulating layer 710 in the overlapping region.

Furthermore, the second data pattern 520 may extend downward from an overlapping region between the second data pattern 520 and the second vertical part 120 of the lower semiconductor layer 100, and overlap a right side of the first upper semiconductor pattern 410. The second data pattern 520 located at the right side of the first upper semiconductor pattern 410 may be a first electrode of the third transistor T3.

The third data pattern 530 may overlap a left side of the third upper semiconductor pattern 430. The third data pattern 530 located at the left side of the third upper semiconductor pattern 430 may be a second electrode of the seventh transistor T7.

Furthermore, the third data pattern 530 may extend upward from an overlapping region between the third data pattern 530 and the third upper semiconductor pattern 430 to cross the initialization voltage line 230 when viewed from the top. The third data pattern 530 may be electrically connected to the initialization voltage line 230 via a fourth contact hole CNT4, which passes through the third insulating layer 730 and the second insulating layer 720 in a region where the third data pattern 530 crosses the initialization voltage line 230.

The third data pattern 530 may further extend upward in the region where the third data pattern 530 crosses the initialization voltage line 230 to overlap the left side of the second upper semiconductor pattern 420 of a neighboring pixel in a preceding row. The second data pattern 520 located at the left side of the first upper semiconductor pattern 410 may be a second electrode of the third transistor T3.

The fourth data pattern 540 may overlap a right side of the third upper semiconductor pattern 430. The fourth data pattern 540 located at the right side of the third upper semiconductor pattern 430 may be a first electrode of the seventh transistor T7.

Furthermore, the fourth data pattern 540 may extend downward from an overlapping region between the fourth data pattern 540 and the third upper semiconductor pattern 430 to overlap the upper portion 121 of the second vertical part 120 of the lower semiconductor layer 100. The fourth data pattern 540 may be in contact with the upper portion 121 of the second vertical part 120 of the lower semiconductor layer 100 via a fifth contact hole CNT5, which passes through the third insulating layer 730, the second insulating layer 720, and the first insulating layer 710 in the overlapping region.

Furthermore, the fourth data pattern 540 may further extend downward from an overlapping region between the fourth data pattern 540 and the lower semiconductor layer 100 to overlap the first light emission control line 220. A width of the lower end of the fourth data pattern 540 may be increased to be in smooth contact with an upper conductive layer.

The fifth data pattern 550 may overlap the upper portion 111 of the first vertical part 110 of the lower semiconductor layer 100. The fifth data pattern 550 may be in contact with the upper portion 111 of the first vertical part 110 of the lower semiconductor layer 100 via a sixth contact hole CNT6, which passes through the third insulating layer 730, the second insulating layer 720, and the first insulating layer 710 in an overlapping region between the fifth data pattern 550 and the upper portion 111.

The fifth data pattern 550 may extend downward from an overlapping region between the fifth data pattern 550 and the lower semiconductor layer 100 to overlap the storage capacitor electrode line 310. The fifth data pattern 550 may be electrically connected to the storage capacitor electrode line 310 via a seventh contact hole CNT7, which passes through the third insulating layer 730 in the overlapping region.

The third conductive layer 500 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Tl), tantalum (Ta), tungsten (W), and copper (Cu). The third conductive layer 500 may be a single-layer film or a multilayer film. For example, the third conductive layer 500 may have a stacked structure such as Tl/Al/Tl, Mo/Al/Mo, Mo/AlGe/Mo, or Ti/Cu.

The fourth insulating layer 740 insulates the third conductive layer 500 and the fourth conductive layer 600 from each other. The fourth insulating layer 740 may be provided on the third conductive layer 500, and generally, on the entire surface of the substrate 750. The fourth insulating layer 740 may be an interlayer insulating film. The fourth insulating layer 740 may include the same material as that of the second insulating layer 720, or at least one of a material of the second insulating layer 720 described above. The fourth insulating layer 740 may be a single-layer film or a multilayer film including stacked films of different materials.

The fourth conductive layer 600 is provided on the fourth insulating layer 740. The fourth conductive layer 600 may include a first supply voltage line 610 for supplying a first supply voltage (e.g., the first supply voltage ELVDD of FIG. 2), and a via electrode 620 for electrical connection between the anode electrode of the OLED and the fourth data pattern 540.

The first supply voltage line 610 may extend in the column direction. The first supply voltage line 610 may extend in the column direction to a pixel neighboring the pixel of FIG. 3. The first supply voltage line 610 may be located at a right side of the data line 560 to be adjacent to the left side of the pixel, but is not limited thereto. The first supply voltage line 610 may be electrically connected to the fifth data pattern 550 via an eighth contact hole CNT8, which passes through the fourth insulating layer 740. The first supply voltage line 610 may be electrically connected to the upper portion 111 of the first vertical part 110 of the lower semiconductor layer 100 and the storage capacitor electrode line 310 via the fifth data pattern 550.

The first supply voltage line 610 may include a cover part protruding in the row direction to cover the upper semiconductor layer 400. Since the upper semiconductor layer 400 is covered with the cover part of the first supply voltage line 610, the upper semiconductor layer 400 may be prevented from being exposed to light emitted from above the upper semiconductor layer 400 in a thickness direction of the upper semiconductor layer 400, e.g., light emitted from the organic emission layer or external light. Thus, the upper semiconductor layer 400 may be prevented from malfunctioning, which may be caused from being exposed to light. A lower part of the upper semiconductor layer 400 is covered with the second conductive layer 300, and thus, may be protected from being exposed to light emitted from below the upper semiconductor layer 400 in the thickness direction.

The via electrode 620 may overlap an expanded part of the fourth data pattern 540. The via electrode 620 may be electrically connected to the fourth data pattern 540 via a ninth contact hole CNT9, which passes through the fourth insulating layer 740. The via electrode 620 may be electrically connected to the upper portion 121 of the second vertical part 120 of the lower semiconductor layer 100 via the fourth data pattern 540.

The fourth conductive layer 600 may include at least one metal selected from the group consisting of molybdenum (No), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 600 may be a single-layer film or a multilayer film. For example, the fourth conductive layer 600 may have a stacked structure such as Ti/Al/Ti, Mo/Al/Mo, Mo/AlGe/Mo, or Ti/Cu.

Although not shown, a fifth insulating layer, a fifth conductive layer, an organic emission layer, and a sixth conductive layer may be sequentially provided on the fourth conductive layer 600. The anode electrode of the OLED may include the fifth conductive layer, and the cathode electrode thereof may include the sixth conductive layer. The anode electrode may be electrically connected to the via electrode 620 through a contact hole passing through the fifth insulating layer.

Figure 6:
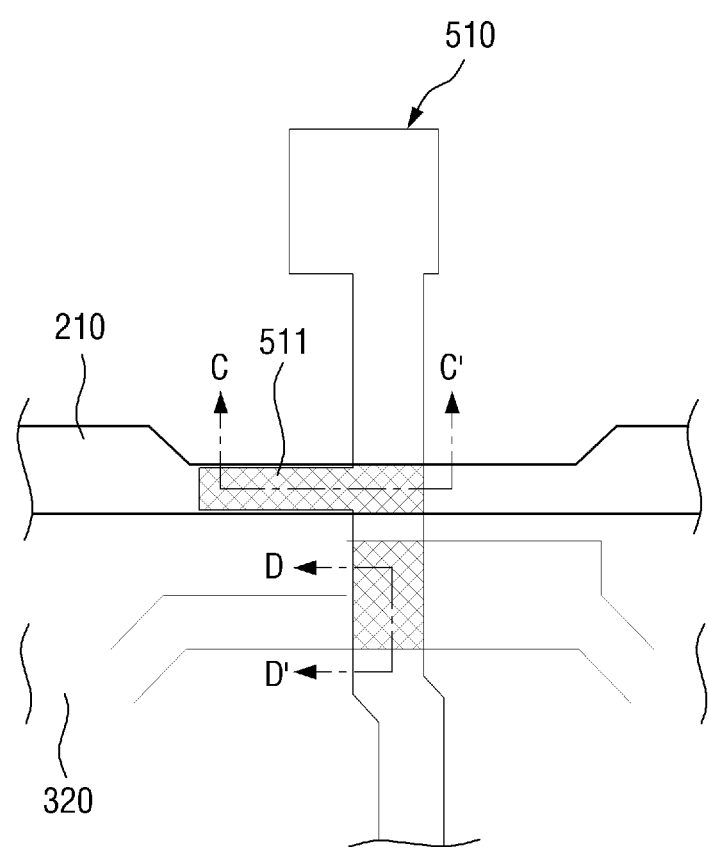
FIG. 6 is a layout diagram illustrating a plan layout relation between a first data pattern, a first scan line, and a second scan line constructed according to another exemplary embodiment of the invention.
Figure 7:
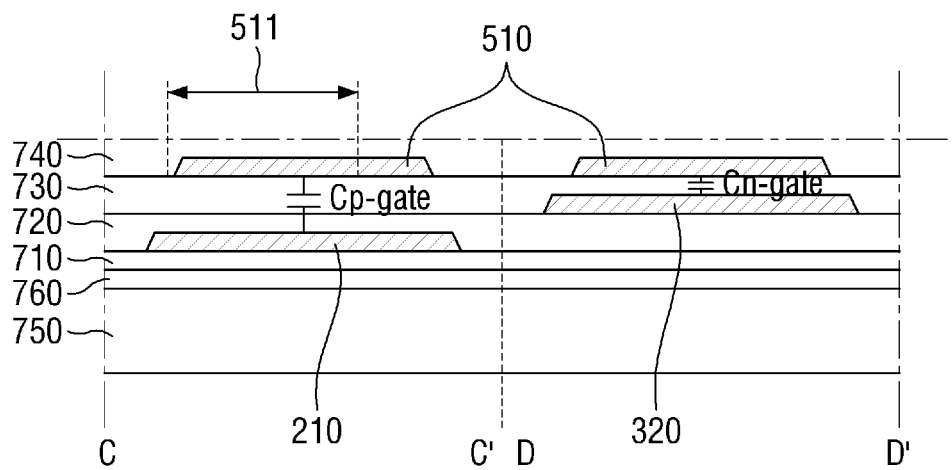
FIG. 7 is a cross-sectional view taken along lines C-C' and D-D' of FIG. 6.
Figure 8:
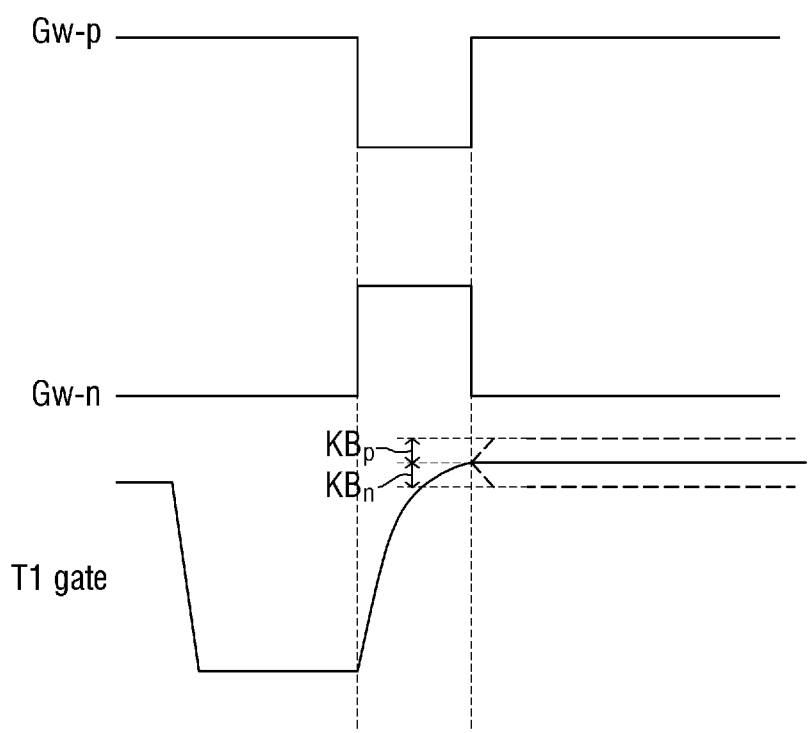
FIG. 8 is a waveform diagram of voltages applied to a first scan line, a second scan line, and a first data pattern.

FIG. 6 is a layout diagram illustrating a plan layout relation between a first data pattern, a first scan line, and a second scan line according to an exemplary embodiment of the invention. FIG. 7 is a cross-sectional view taken along lines C-C' and D-D' of FIG. 6. FIG. 8 is a waveform diagram of voltages applied to a first scan line, a second scan line, and a first data pattern.

Referring to FIGS. 3 and 6 to 8, the first data pattern 510 intersects the first scan line 210 and the second scan line 320 while electrically connecting the gate electrode 240 of the first transistor T1, the second electrode of the third transistor T3, and the first electrode of the fourth transistor T4 to one another.

The first data pattern 510 overlaps the first scan line 210 in a region where the first data pattern 510 and the first scan line 210 intersect each other, to form the first parasitic capacitor Cp-gate. A first electrode of the first parasitic capacitor Cp-gate corresponds to the first scan line 210, a second electrode thereof corresponds to the first data pattern 510, and a dielectric thereof corresponds to the second insulating layer 720 and the third insulating layer 730 located between the first data pattern 510 and the first scan line 210.

The first data pattern 510 overlaps the second scan line 320 in a region where the first data pattern 510 and the second scan line 320 intersect each other, to form a second parasitic capacitor Cn-gate. A first electrode of the second parasitic capacitor Cn-gate corresponds to the second scan line 320, a second electrode thereof corresponds to the first data pattern 510, and a dielectric thereof corresponds to the third insulating layer 730 located between the first data pattern 510 and the second scan line 320.

A first scan signal Gw_p and a second scan signal Gw_n are respectively supplied to the first scan line 210 and the second scan line 320. The first scan signal Gw-p and the second scan signal Gw-n may be signals having different logic high/low levels at the same time.

The first scan signal Gw_p supplied to the first scan line 210 controls the second transistor T2, which is a PMOS transistor. The second transistor T2 is turned on when a low voltage is applied, and is turned off when a high voltage is applied.

In contrast, the second scan signal Gw_n supplied to the second scan line 320 controls the third transistor T3, which is an NMOS transistor. The third transistor is turned on when a high voltage is applied, and is turned off when a low voltage is applied.

When the second transistor T2 is switched from turn on to turn off, the gate electrode 240 of the first transistor T1 may be influenced by a positive kickback voltage. In detail, when the first scan signal Gw_p supplied to the first electrode of the first parasitic capacitor Cp-gate is switched from a logic low level to a logic high level, the second electrode of the first parasitic capacitor Cp-gate is coupled to the first electrode of the first parasitic capacitor Cp-gate, and thus, a voltage thereof is increased by a first kickback voltage KBp. Thus, a voltage of the gate electrode 240 of the first transistor T1 connected to the second electrode of the first parasitic capacitor Cp-gate may be increased by the first kickback voltage KBp.

When the third transistor T3 is switched from turn on to turn off, the gate electrode 240 of the first transistor T1 may be influenced by a negative kickback voltage. In detail, when the second scan signal Gw_n supplied to the first electrode of the second parasitic capacitor Cn-gate is switched from a logic high level to a logic low level, the second electrode of the second parasitic capacitor Cn-gate is coupled to the first electrode of the second parasitic capacitor Cn-gate, and thus, a voltage thereof is reduced by a second kickback voltage KBn. Thus, a voltage of the gate electrode 240 of the first transistor T1 connected to the second electrode of the second parasitic capacitor Cn-gate may be reduced by the second kickback voltage KBn.

When the second transistor T2 and the third transistor T3 are simultaneously turned off, the gate electrode 240 of the first transistor T1 may be influenced by both the first kickback voltage KBp, which is a positive voltage, and the second kickback voltage KBn, which is a negative voltage. That is, the voltage of the gate electrode 240 of the first transistor T1 may be changed by the magnitude of subtracting the second kickback voltage KBn from the first kickback voltage KBp. When the second transistor T2 and the third transistor T3 are turned off at different times, and no other voltage is not applied in a time period between the turning off of the second transistor T2 and the turning off of the third transistor T3, the first kickback voltage KBp and the second kickback voltage KBn may be sequentially applied to the gate electrode 240 of the first transistor T1. Accordingly, a voltage of the gate electrode 240 of the first transistor T1 may be changed by the sum of the first kickback voltage KBp, which is a positive voltage, and the second kickback voltage KBn, which is a negative voltage.

As a result, the voltage of the gate electrode 240 of the first transistor T1 reflecting the kickback voltages are lower than that in a case where both the second transistor T2 and the third transistor T3 are PMOS transistors. Since the first transistor T1 is a PMOS transistor, implementing black luminance becomes more difficult when the voltage of the gate electrode 240 of the first transistor T1 is low. While the black luminance may be implemented by reducing the first supply voltage ELVDD, such may also require reduction of the second supply voltage ELVSS, which may be beyond the power supply limit of an external voltage source that is conventionally used in an organic light-emitting display device including only PMOS transistors.

According to an exemplary embodiment, the kickback voltages KBp and KBn may be adjusted to implement black luminance even when a general-purpose external voltage source is used. For example, even if the second kickback voltage KBn remains the same, increasing the first kickback voltage KBp may increase the magnitude of the overall kickback voltage, and thus, a voltage of the gate electrode 240 of the first transistor T1 may be prevented from being excessively reduced.

Generally, a kickback voltage caused by a parasitic capacitor is proportional to a capacitance of the parasitic capacitor. The capacitance increases as an overlapping area of two opposite electrodes becomes increased. Thus, as an overlapping region between the two electrodes of the first parasitic capacitor Cp-gate (e.g., an overlapping region of the first scan line 210 and the first data pattern 510) increases, the capacitance of the first parasitic capacitor Cp-gate would be increased, which may increase the kickback voltage.

Referring back to FIG. 6, the first data pattern 510 may further include the first branch part 511 protruding in the direction to which the first scan line 210 extends, and overlapping the first scan line 210.

As compared to a case where the first data pattern 510 intersects the first scan line 210 in a uniform width and does not include the first branch part 511, the first data pattern 510 according to an exemplary embodiment includes the first branch part 511. Accordingly, the overlapping region between the two electrodes of the first parasitic capacitor Cp-gate is increased by a region of the first branch part 511 overlapping the first scan line. Thus, the kickback voltage caused by the first parasitic capacitor Cp-gate may be increased. From a view point in a direction to which the first data pattern 510 generally extends, the line width of the first data pattern 510 is increased in an overlapping region between the first data pattern 510 and the first scan line 210 by the first branch part 511. That is, the line width of a region of the first data pattern 510 intersecting the first scan line 210 may be greater than the line widths of the first data pattern 510 near the intersecting region.

When a part of the first data pattern 510 extending in the column direction to which the first data pattern 510 mainly extends is defined as a stem part, the first branch part 511 may branch from a region of the stem part intersecting the first scan line 210 and protrude in the row direction, e.g., a left direction. The first branch part 511 extends in the left direction while overlapping the first scan line 210. As the protruding length of the first branch part 511 increases, an overlapping area between the first data pattern 510 and the first scan line 210 may be increased. To maximize the overlapping region between the first data pattern 510 and the first scan line 210 in a given length of the protruding portion of the first branch part 511, the first branch part 511 and the first scan line 210 may completely overlap each other in a width direction (the column direction). That is, a planar pattern of the first branch part 511 may be the same as that of the first scan line 210, and may coincide with the planar pattern of the first scan line 210 in the overlapping region of the first branch part 511 and the first scan line 210. The first branch part 511 may extend towards the data line 560 but does not overlap the data line 560 and is spaced apart from the data line 560.

In one exemplary embodiment, the length of the protruding portion of the first branch part 511 may be greater than a width of the stem part of the first data pattern 510 in the region where the stem part of the first data pattern 510 intersects the first scan line 210. In one exemplary embodiment, an overlapping area of the stem part of the first data pattern 510 excluding the first branch part 511 and the first scan line 210 may be less than that of the first data pattern 510 and the second scan line 320. However, an overlapping area of the first data pattern 510 including the first branch part 511 and the first scan line 210 may be greater than that of the first data pattern 510 and the second scan line 320. Furthermore, a capacitance of the first parasitic capacitor Cp-gate between the first data pattern 510 and the first scan line 210 may be equal to or greater than that of the second parasitic capacitor Cn-gate between the first data pattern 510 and the second scan line 320.

In some exemplary embodiments, the overlapping area between the first data pattern 510 including the first branch part 511 and the first scan line 210 may be three times greater than that of the first data pattern 510 and the second scan line 320.

In the present exemplary embodiment, a voltage of the gate electrode 240 of the first transistor T1 may be effectively prevented from being excessively reduced due to a kickback, only by forming the first branch part 511 without modifying a layout to a large extent or reducing a resolution according to the modification to the layout. Accordingly, a conventional external voltage source that is used in an organic light-emitting display device including only PMOS transistors may be utilized, which may reduce manufacturing costs.

Figure 9:
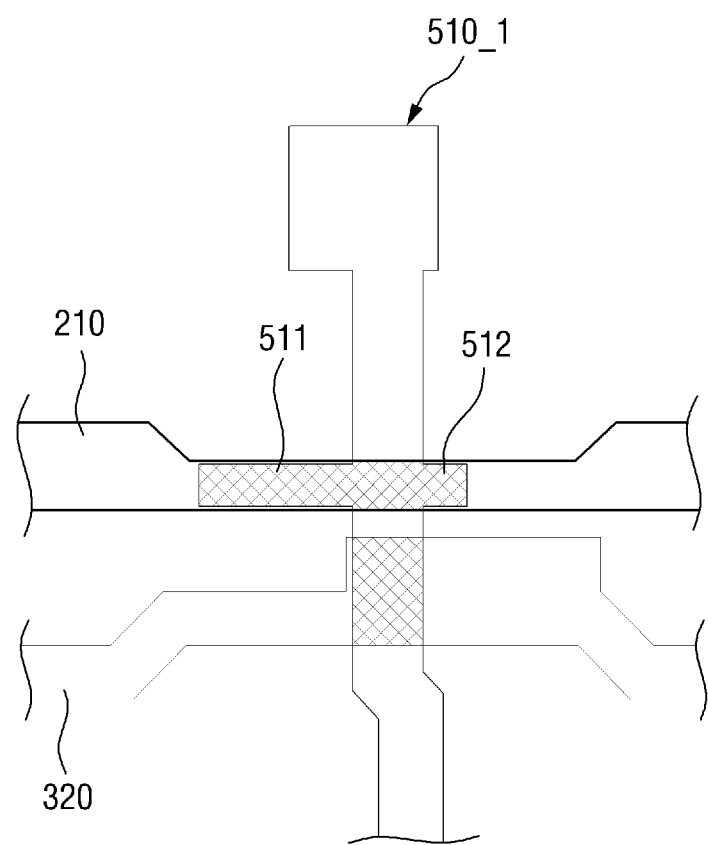
FIG. 9 is a layout diagram illustrating a plan layout relation between a first data pattern, a first scan line, and a second scan line constructed according to another exemplary embodiment of the invention.

FIG. 9 is a layout diagram illustrating a plan layout relation between a first data pattern, a first scan line, and a second scan line according to another exemplary embodiment of the invention.

Referring to FIG. 9, the layout diagram is different from that of FIG. 6 in that a first data pattern 510_1 further includes a second branch part 512, in addition to a first branch part 511. The second branch part 512 branches from a region where a stem part of the first data pattern 510_1 intersects a first scan line 210 and protrudes in a right direction that is opposite to a direction to which the first branch part 511 protrudes. The second branch part 512 extends in the right direction while overlapping the first scan line 210. However, the second branch part 512 does not overlap the second data pattern 520, which is the first electrode of the third transistor T3, and is spaced apart from the second data pattern 520. Although the length of the protruding portion of the second branch part 512 may be shorter than that of the first branch part 511 due to an insufficient distance to the second data pattern 520 adjacent thereto, an overlapping area of the first data pattern 510_1 and the first scan line 210 may be further increased by the second branch part 512.

Figure 10:
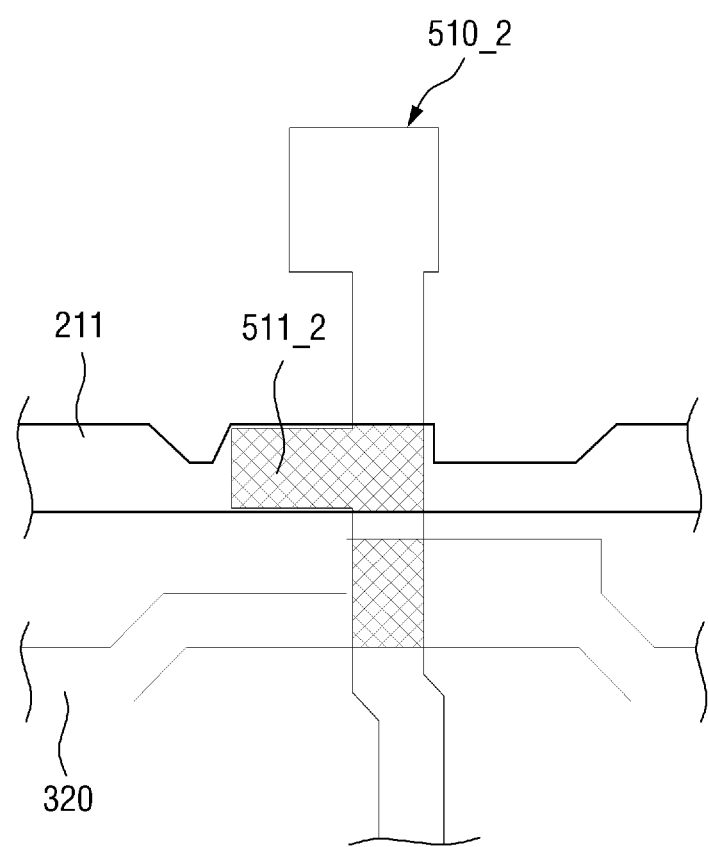
FIG. 10 is a layout diagram illustrating a plan layout relation between a first data pattern, a first scan line and a second scan line constructed according to another exemplary embodiment of the invention.

FIG. 10 is a layout diagram illustrating a plan layout relation between a first data pattern, a first scan line, and a second scan line according to another exemplary embodiment of the invention.

Referring to FIG. 10, the layout diagram is different from that of FIG. 6 in that a line width of a region of a first scan line 211 overlapping a first branch part 511_2 of a first data pattern 510_2 is increased. That is, in the exemplary embodiment of FIG. 6, a line width of the first scan line 210 is uniform near the region overlapping the first branch part 511_2, whereas in the present exemplary embodiment, the line width of the first scan line 211 is increased to be thicker near the region overlapping the first branch part 511_2.

The line width of the first scan line 211 may be increased by moving sidewalls of the first scan line 211 upwards when viewed from the top, which are upper parts formed thereon in a plan view. As used herein, the term "sidewalls" may be referred to as parts forming a boundary of a specific pattern and consisting of lines on a plan layout.

An increase in the line width of the overlapping region of the first scan line 211 may allow an increase in a line width of the first branch part 511_2, and thus an overlapping area between the first data pattern 510_2 and the first scan line 211 may be further increased.

Figure 11:
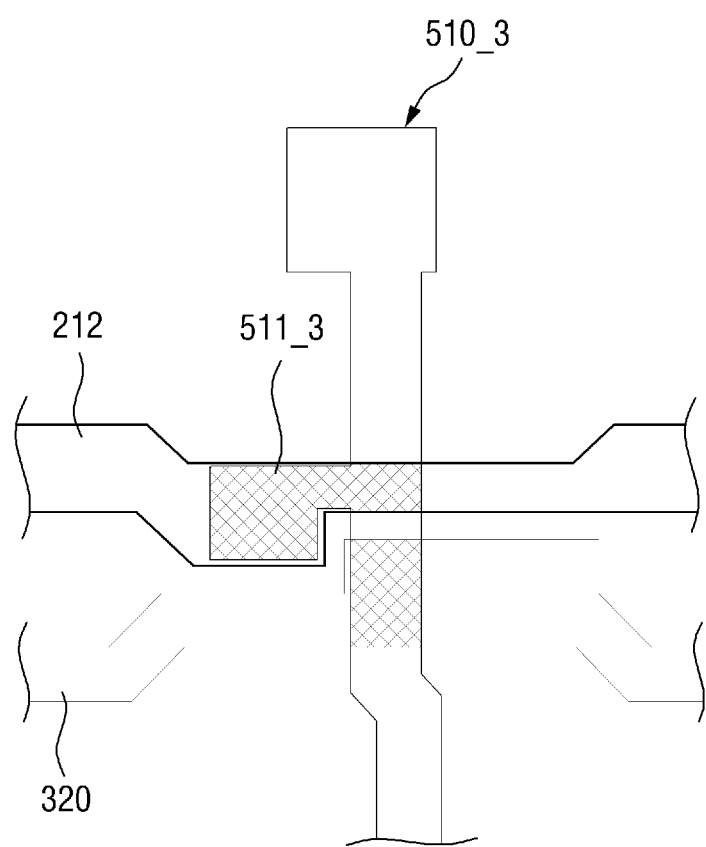
FIG. 11 is a layout diagram illustrating a plan layout relation between a first data pattern, a first scan line, and a second scan constructed according to another exemplary embodiment of the invention.

FIG. 11 is a layout diagram illustrating a plan layout relation between a first data pattern, a first scan line, and a second scan line according to another exemplary embodiment of the invention.

Referring to FIG. 11, the layout diagram is similar to that of FIG. 10 in that a line width of a first scan line 212 overlapping a first branch part 511_3 of a first data pattern 510_3 is increased, but is different in that the line width of the overlapping region of the first scan line 212 is increased by moving sidewalls of the first scan line 212 downwards when viewed from the top, which are lower parts in a plan view.

A line width of the sidewalls of the first scan line 212, which are increased by moving downwards when viewed from the top, may be reduced again near a gate electrode of a third transistor T3 of a second scan line 320, by moving portions of the sidewalls of the first scan line 212 upwards when viewed from the top. The first branch part 511_3 extends in a left direction while having a relatively narrow line width to correspond to the line width of the first scan line 212 when the first branch part 511_3 branches from the first data pattern 510_3, but the line width thereof may be increased in a region where the first scan line 212 has an expanded line width.

Similarly, in the present exemplary embodiment, line widths of the first scan line 212 and the first branch part 511_3 are increased, and thus, an overlapping area therebetween may be increased, as compared to the exemplary embodiment of FIG. 6.

Figure 12:
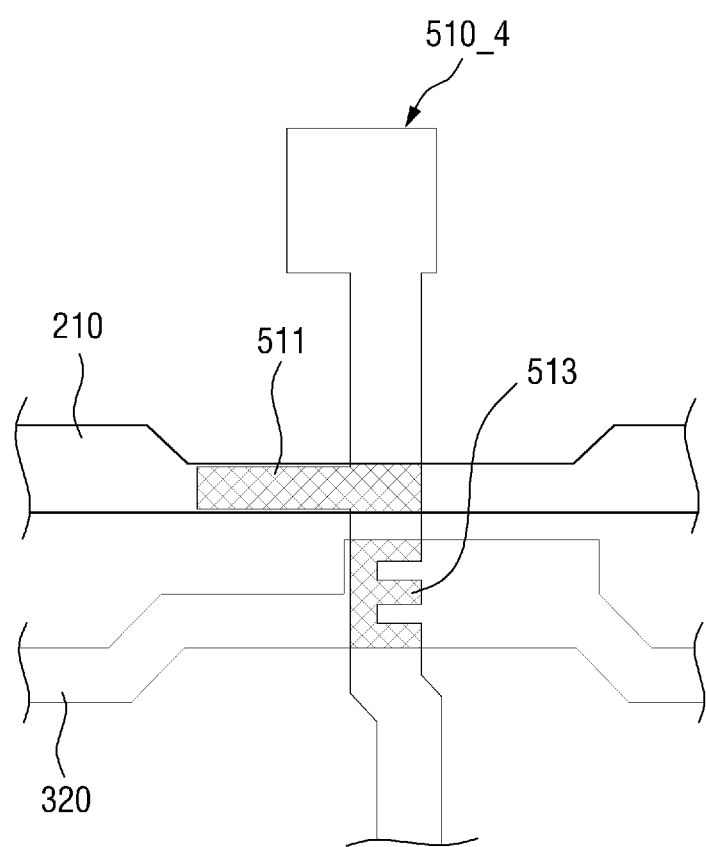
FIG. 12 is a layout diagram illustrating a plan layout relation between a first data pattern, a first scan line, and a second scan constructed according to another exemplary embodiment of the invention.

FIG. 12 is a layout diagram illustrating a plan layout relation between a first data pattern, a first scan line, and a second scan line according to another exemplary embodiment of the invention.

Referring to FIG. 12, an average line width may be reduced in an area of a first data pattern 510_4 intersecting a second scan line 320. For example, the first data pattern 510_4 may include a concave pattern, which is inwardly recessed in the region intersecting the second scan line 320. The concave pattern may be formed on at least one of a left sidewall and a right sidewall of the first data pattern 510_4. When the concave pattern is formed on the right sidewall of the first data pattern 510_4, a channel width of the third transistor T3 may be increased.

The concave pattern of the first data pattern 510_4 is defined by an empty part of the first data pattern 510_4, and thus, the area and average line width of the first data pattern 510_4 are reduced by those of the concave pattern. Accordingly, an overlapping area of the first data pattern 510_4 and the second scan line 320 may be reduced, and a capacitance of the second parasitic capacitor Cn-gate may be reduced. Accordingly, an absolute value of a kickback voltage KBn caused by the second parasitic capacitor Cn-gate may be reduced and a voltage of the gate electrode 240 of the first transistor T1 may be prevented from being excessively reduced.

In a display device according to exemplary embodiments, a voltage of a first transistor gate electrode can be effectively prevented from being excessively reduced due to a kickback, without modifying a layout of the display device to a large extent or reducing a resolution thereof according to the modified layout. Accordingly, a conventional external voltage source used in an organic light-emitting display device including only PMOS transistors may be utilized, which may reduce manufacturing costs.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a light-emitting diode;
   a first transistor electrically connected to the light-emitting diode to supply a driving current to the light-emitting diode, the first transistor comprising a first gate electrode, a first channel region overlapping the first gate electrode in a plan view, and a first electrode, and a second electrode which is electrically connected to the light-emitting diode;
   a first scan line configured to transmit a first signal to a second gate electrode of a second transistor, the second gate electrode being a portion of the first scan line;
   a second scan line configured to transmit a second signal to a third gate electrode of a third transistor, the third gate electrode being a portion of the second scan line; and
   a conductive pattern physically connected to the first gate electrode,
   wherein:
   the conductive pattern overlaps the first scan line and the second scan line in the plan view; and
   one of the second transistor and the third transistor is a PMOS transistor, and the other one of the second transistor and the third transistor is an NMOS transistor.

2. The display device of claim 1, wherein an overlapping area of the conductive pattern and the first scan line is different from an overlapping area of the conductive pattern and the second scan line.

3. The display device of claim 2, wherein the overlapping area of the conductive pattern and the first scan line is larger than the overlapping area of the conductive pattern and the second scan line.

4. The display device of claim 3, wherein the second transistor is the PMOS transistor, and the third transistor is the NMOS transistor.

5. The display device of claim 4, further comprising a data line,
   wherein the second transistor further comprises a second channel region overlapping the second gate electrode in the plan view, a third electrode physically connected to the data line, and a fourth electrode physically connected to the first electrode.

6. The display device of claim 4, wherein the third transistor further comprises a third channel region overlapping the third gate electrode in the plan view, a fifth electrode physically connected to the second electrode, and a sixth electrode physically connected to the conductive pattern.

7. The display device of claim 6, wherein the sixth electrode and the conductive pattern are formed in one body.

8. The display device of claim 5, wherein the first transistor is the PMOS transistor.

9. The display device of claim 1, wherein a first capacitance between the conductive pattern and the first scan line is configured to be greater than a second capacitance between the conductive pattern and the second scan line.

10. The display device of claim 1, wherein the conductive pattern comprises:
a stem part extending in one direction; and
a branch part branching from the stem part and overlapping the first scan line.

11. The display device of claim 1, wherein:
the first signal comprises a first logic high level and a first logic low level;
the second signal comprises a second logic high level and a second logic low level; and
the first signal having the first logic low level and the second signal having the second logic high level are configured to be transmitted at the same point of time.

12. The display device of claim 1, further comprising:
a substrate;
a first semiconductor layer disposed on the substrate, the first semiconductor layer comprising a second channel region of the second transistor overlapping the second gate electrode in the plan view;
a first insulating layer disposed on the first semiconductor layer;
a first conductive layer disposed on the first insulating layer, the first conductive layer comprising the first scan line extending in a first direction;
a second insulating layer disposed on the first conductive layer;
a second conductive layer disposed on the second insulating layer, the second conductive layer comprising the second scan line extending in the first direction;
a third insulating layer disposed on the second conductive layer;
a second semiconductor layer disposed on the third insulating layer, the second semiconductor layer comprising a third channel region of the third transistor overlapping the third gate electrode in the plan view; and
a third conductive layer disposed on the second semiconductor layer, the third conductive layer comprising the conductive pattern.

13. The display device of claim 12, wherein:
the third transistor further comprises a third electrode and a fourth electrode;
the third electrode and the fourth electrode are disposed on the third channel region; and
one of the third electrode and the fourth electrode is a portion of the conductive pattern.

14. The display device of claim 12, further comprising:
a fourth insulating layer disposed on the third conductive layer; and
a fourth conductive layer disposed on the fourth insulating layer,
wherein the fourth conductive layer comprises a first supply voltage line which is electrically connected to the first electrode.

15. The display device of claim 14, wherein the first supply voltage line is overlapped with the third channel region in the plan view.

16. A display device comprising:
a light-emitting diode;
a first transistor electrically connected to the light-emitting diode to supply a driving current to the light-emitting diode, the first transistor comprising a first gate electrode, a first channel region, a first electrode, and a second electrode which is electrically connected to the light-emitting diode;
a second transistor, the second transistor comprising a second gate electrode which is a portion of a first scan line;
a third transistor, the third transistor comprising a third gate electrode which is a portion of a second scan line; and
a conductive pattern physically connected to the first gate electrode,
wherein the conductive pattern overlaps the first scan line and the second scan line in a plan view.

17. The display device of claim 16, wherein the second transistor is a PMOS transistor, and the third transistor is a NMOS transistor.

18. The display device of claim 16, wherein an overlapping area of the conductive pattern and the first scan line is larger than the overlapping area of the conductive pattern and the second scan line.

19. The display device of claim 16, further comprising a substrate,
wherein the first scan line, the second scan line, the conductive pattern and the light-emitting diode are sequentially disposed on the substrate.

20. The display device of claim 19, further comprising:
a first semiconductor layer disposed on the substrate, the first semiconductor layer comprising a second channel region of the second transistor overlapping the second gate electrode in the plan view; and
a second semiconductor layer disposed on the first semiconductor layer, the second semiconductor layer comprising a third channel region of the third transistor overlapping the third gate electrode in the plan view,
wherein the third channel region is farther than the second channel region from the substrate.

21. The display device of claim 20, further comprising a first supply voltage line electrically connected to the first electrode, wherein:
the first supply voltage line is disposed on the conductive pattern; and
the first supply voltage line is overlapped with the third channel region in the plan view.

* * * * *